United States Patent
Jeong et al.

(10) Patent No.: US 8,003,450 B2
(45) Date of Patent: Aug. 23, 2011

(54) THIN FILM TRANSISTOR, METHOD OF FABRICATING A THIN FILM TRANSISTOR AND FLAT PANEL DISPLAY DEVICE HAVING THE SAME

(75) Inventors: Jae-Kyeong Jeong, Suwon-si (KR); Hyun-Soo Shin, Suwon-si (KR); Yeon-Gon Mo, Suwon-si (KR); Hyung-Jun Kim, Pohang-si (KR); Seong-Joon Lim, Pohang-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 211 days.

(21) Appl. No.: 12/318,244

(22) Filed: Dec. 23, 2008

(65) Prior Publication Data

US 2009/0166641 A1    Jul. 2, 2009

(30) Foreign Application Priority Data

Dec. 27, 2007 (KR) .......................... 10-2007-0139040

(51) Int. Cl.
*H01L 21/00* (2006.01)

(52) U.S. Cl. ........ 438/149; 438/151; 438/585; 438/778; 257/E21.409; 257/E21.411

(58) Field of Classification Search ............... 438/159, 438/161; 257/E21.37, E21.372, E21.4, E21.457, 257/E21.533, E21.615
See application file for complete search history.

(56) References Cited

U.S. PATENT DOCUMENTS

| | | | |
|---|---|---|---|
| 6,355,561 B1 | 3/2002 | Sandhu et al. | |
| 6,727,522 B1* | 4/2004 | Kawasaki et al. | 257/103 |
| 6,926,572 B2 | 8/2005 | Park et al. | |
| 7,208,768 B2 | 4/2007 | Ono et al. | |
| 2004/0198029 A1 | 10/2004 | Yasuda et al. | |
| 2005/0017247 A1* | 1/2005 | Koo et al. | 257/72 |
| 2006/0113539 A1 | 6/2006 | Sano et al. | |
| 2009/0072233 A1* | 3/2009 | Hayashi et al. | 257/43 |
| 2009/0267064 A1* | 10/2009 | Yano et al. | 257/43 |

FOREIGN PATENT DOCUMENTS

| | | |
|---|---|---|
| JP | 2000-277742 A | 10/2000 |
| JP | 2003-176109 | 6/2003 |
| JP | 2005-321790 | 11/2005 |

(Continued)

OTHER PUBLICATIONS

Barquinha, P., et al., "Influence of the semiconductor thickness on the electrical properties of transparent TFTs based on indium zinc oxide", Journal of Non-Crystalline Solids, 352:1749-1752 (2006).

(Continued)

*Primary Examiner* — Cheung Lee
(74) *Attorney, Agent, or Firm* — Lee & Morse, P.C.

(57) ABSTRACT

A thin film transistor (TFT) includes a substrate, a transparent semiconductor layer on the substrate, the transparent semiconductor layer including zinc oxide and exhibiting a charge concentration of about $1 \times 10^{14}$ atom/cm$^3$ to about $1 \times 10^{17}$ atom/cm$^3$, a gate electrode on the substrate, a gate insulating layer between the gate electrode and the transparent semiconductor layer, the gate insulting layer insulating the gate electrode from the transparent semiconductor layer, and source and drain electrodes on the substrate, the source and drain electrodes being in contact with the transparent semiconductor layer.

16 Claims, 5 Drawing Sheets

FOREIGN PATENT DOCUMENTS

| | | |
|---|---|---|
| KR | 10-2001-0089452 A | 10/2001 |
| KR | 10-2003-0064599 A | 8/2003 |
| KR | 10-2004-0014418 A | 2/2004 |
| KR | 10-2005-0092505 A | 9/2005 |
| KR | 10-2006-0024545 A | 3/2006 |
| KR | 10-2007-0035373 A | 3/2007 |
| KR | 10-2007-0085828 A | 8/2007 |
| WO | WO 00/30183 | 5/2000 |
| WO | WO 02/43125 A2 | 5/2002 |

OTHER PUBLICATIONS

Liu, Day-Shan, et al., "Microstructure investigations of indium tin oxide films cosputtered with zinc oxide at room temperature", J. Vac. Sci. Technol. A24(3):694-699 (May/Jun. 2006).

Park, Sang-Hee Ko, et al., Characteristics of ZnO Thin Films by Means of Plasma-Enhanced Atomic Layer Deposition:, Electrochemical and Solid-State Letters 9(10):G299-G301 (2006).

\* cited by examiner

FIG. 2B ized society, demands for, e.g., personal computers, car navigation systems, personal digital assistances (PDAs), data communication devices or combination products thereof, are increasing. Such products may require FPD devices with, e.g., good visibility, wide viewing angle characteristics, fast response time, and so forth, for displaying information.

THIN FILM TRANSISTOR, METHOD OF FABRICATING A THIN FILM TRANSISTOR AND FLAT PANEL DISPLAY DEVICE HAVING THE SAME

CROSS-REFERENCE TO RELATED APPLICATION

This application is related to co-pending U.S. patent application Ser. No. 12/318, 212, entitled "Thin Film Transistor, Method of Fabricating A Thin Film Transistor and Flat Panel Display Device Having the Same," which was filed on Dec. 23, 2008.

BACKGROUND OF THE INVENTION

1. Field of the Invention

Example embodiments relate to a thin film transistor (TFT). More particularly, example embodiments relate to a TFT having improved characteristics formed, to a method of fabricating the same, and to a flat panel display (FPD) device including the same.

2. Description of the Related Art

With the advent of a highly developed information-oriented society, demands for, e.g., personal computers, car navigation systems, personal digital assistances (PDAs), data communication devices or combination products thereof, are increasing. Such products may require FPD devices with, e.g., good visibility, wide viewing angle characteristics, fast response time, and so forth, for displaying information.

A conventional FPD device, e.g., an organic light emitting diode (OLED) display device, a liquid crystal display (LCD) device, and so forth, may include a TFT as a switching device for driving a pixel in the FPD. A conventional TFT may include a gate electrode on a semiconductor layer, and source/drain electrodes. The components of the conventional TFT, however, may be formed of opaque materials, e.g., amorphous or crystalline silicon. Thus, when a TFT with opaque components is used as a switching device in a FPD device, e.g., an OLED display device, there may be a limit to an increase in width of a channel of the TFT due to the characteristics of the opaque semiconductor layer. A limited channel width of the conventional TFT may limit current flow therethrough and may require high voltage application, thereby increasing power consumption in the FPD, e.g., deteriorating an OLED in an OLED display device and increasing power consumption thereof.

SUMMARY OF THE INVENTION

Embodiments are therefore directed to a TFT, a FPD having the same, and associated methods, which substantially overcome one or more of the disadvantages of the related art.

It is therefore a feature of an embodiment to provide a TFT with a transparent semiconductor layer exhibiting reduced charge concentration.

It is another feature of an embodiment to provide a FPD with a TFT including a transparent semiconductor layer exhibiting reduced charge concentration.

It is yet another feature of an embodiment to provide a method of manufacturing a TFT with a transparent semiconductor layer exhibiting reduced charge concentration.

At least one of the above and other features and advantages may be realized by providing a TFT, including a substrate, a transparent semiconductor layer on the substrate, the transparent semiconductor layer including zinc oxide and exhibiting a charge concentration of about $1\times10^{14}$ atom/cm$^3$ to about $1\times10^{17}$ atom/cm$^3$, a gate electrode on the substrate, a gate insulating layer between the gate electrode and the transparent semiconductor layer, the gate insulting layer insulating the gate electrode from the transparent semiconductor layer, and source and drain electrodes on the substrate, the source and drain electrodes being in contact with the transparent semiconductor layer.

The transparent semiconductor layer may be between the substrate and the gate insulating layer. The TFT may further include an interlayer insulating layer on the substrate, the gate insulating layer, gate electrode, and interlayer insulating layer being sequentially stacked on the transparent semiconductor layer, and the source and drain electrodes being connected to the transparent semiconductor layer through the gate insulating layer and interlayer insulating layer. The gate electrode may be disposed between the substrate and the gate insulating layer. The source and drain electrodes may be spaced apart from each other on the gate insulating layer, the source and drain electrodes being disposed to correspond to both sides of the gate electrode, and the transparent semiconductor layer being on the source and drain electrodes and including a portion on the gate insulating layer between the source and drain electrodes. The substrate may include one or more of a single crystalline silicon, glass, plastic, sapphire and quartz. The transparent semiconductor layer may have a thickness of about 30 nm to about 150 nm. The transparent semiconductor layer may be a p-type semiconductor layer.

At least one of the above and other features and advantages may be realized by providing a method of fabricating a TFT, including forming a transparent semiconductor layer on a substrate, the transparent semiconductor layer including zinc oxide and exhibiting a charge concentration of about $1\times10^{14}$ atom/cm$^3$ to about $1\times10^{17}$ atom/cm$^3$, forming a gate electrode on the substrate, forming a gate insulating layer between the gate electrode and the transparent semiconductor layer, the gate insulting layer insulating the gate electrode from the transparent semiconductor layer, and forming source and drain electrodes on the substrate, the source and drain electrodes being in contact with the transparent semiconductor layer.

The method may further include forming a buffer layer on the substrate, forming a zinc oxide layer on the buffer layer by atomic layer deposition using an oxidizing agent having nitrogen, forming the transparent semiconductor layer by patterning the zinc oxide layer, a channel region of the transparent semiconductor layer having a charge concentration of about $1\times10^{14}$ atom/cm$^3$ to about $1\times10^{17}$ atom/cm$^3$, forming the gate insulating layer on the transparent insulating layer, forming the gate electrode on the gate insulating layer, forming an interlayer insulating layer on the gate electrode, and forming the source and drain electrodes on the interlayer insulating layer, one of the source and drain electrodes being connected to the gate electrode. The oxidizing agent may include one or more of ammonium hydroxide, nitrogen monoxide, nitrogen dioxide and nitric acid. The method may further include forming the gate electrode on the substrate, forming the gate insulating layer on the gate electrode, forming the source and drain electrodes on the gate insulating layer, the source and drain electrodes being spaced apart from each and disposed to correspond to both sides of the gate electrode, forming a zinc oxide layer on the source and drain electrodes by atomic layer deposition using an oxidizing agent having nitrogen, and patterning the zinc oxide layer to form the transparent semiconductor layer, the transparent semiconductor layer being connected with the source and drain electrodes and having a charge concentration of about $1\times10^{14}$ atom/cm$^3$ to about $1\times10^{17}$ atom/cm$^3$ in a channel region thereof. The oxidizing agent may include one or more of ammonium hydroxide, nitrogen monoxide, nitrogen dioxide and nitric acid.

At least one of the above and other features and advantages may be realized by providing a FPD device, including a TFT with a substrate, a transparent semiconductor layer on the substrate, the transparent semiconductor layer including zinc oxide and exhibiting a charge concentration of about $1 \times 10^{14}$ atom/cm$^3$ to about $1 \times 10^{17}$ atom/cm$^3$, a gate electrode on the substrate, a gate insulating layer between the gate electrode and the transparent semiconductor layer, the gate insulting layer insulating the gate electrode from the transparent semiconductor layer, and source and drain electrodes on the substrate, the source and drain electrodes being in contact with the transparent semiconductor layer, and a pixel part including at least one pixel and being in electrical communication with the TFT via at least one of the source and drain electrodes of the TFT. The transparent semiconductor layer of the TFT may have a thickness of about 30 nm to about 150 nm. The FPD may be an OLED display device.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Korean Patent Application No. 10-2007-0139040, filed on Dec. 27, 2007, in the Korean Intellectual Property Office, and entitled: "Thin Film Transistor, Method of Fabricating Thin Film Transistor and Flat Panel Display Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

As used herein, the term "transparent" includes "transparent or permeable."

Figure 1A:
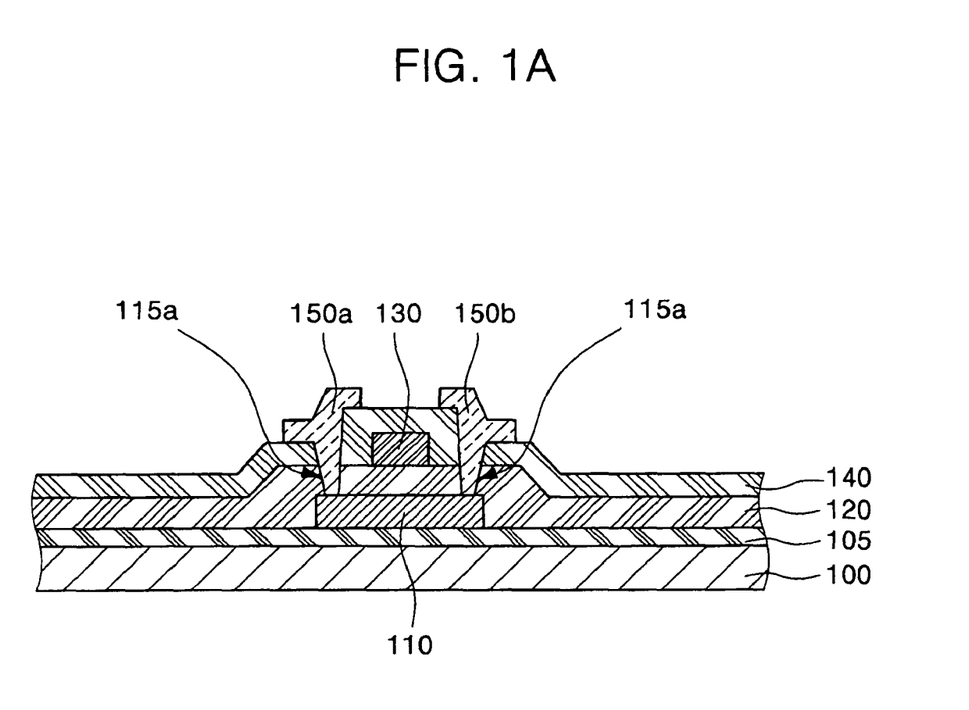
FIG. 1A illustrates a cross-sectional view of a TFT according to an example embodiment.

FIG. 1A illustrates a cross-sectional view of a TFT according to an example embodiment. Referring to FIG. 1A, a TFT may include a substrate 100, a transparent semiconductor layer 110 on the substrate 100, a gate electrode 130 on the transparent semiconductor layer 110, and source/drain electrodes 150a and 150b in contact with the transparent semiconductor layer 110.

The substrate 100 of the TFT may be formed of a transparent material. For example, the substrate 100 may include one or more of a single crystalline silicon, glass, plastic, sapphire and quartz. The substrate 100 may be flexible. A buffer layer 105 may be formed on the substrate 100 to prevent penetration of impurities into the substrate 100.

The transparent semiconductor layer 110 of the TFT may be transparent, e.g., may include one or more of ZnO, ZnSnO, CdSnO, GaSnO, TiSnO, InGaZnO, CuAlO, SrCuO and LaCuOS, and may be formed on the substrate 100 by atomic layer deposition (ALD). For example, the transparent semiconductor layer 110 may be formed on the buffer layer 105, so the buffer layer 105 may be between the substrate 100 and the transparent semiconductor layer 110 to prevent penetration of impurities therebetween. The transparent semiconductor layer 110 may be formed to a thickness of about 30 nm to about 150 nm. It is noted that a thickness of the transparent semiconductor layer 110 in a range of about 30 nm to about 150 nm may provide excellent electron mobility and on/off current ratio. It is further noted that thickness of the transparent semiconductor layer 110 may be measured from a lower surface of the transparent semiconductor layer 110, i.e., a surface facing the substrate 100, to an upper surface of the transparent semiconductor layer 110, i.e., a surface opposite the lower surface and facing away from the substrate 100, along a normal to the substrate 100. The transparent semiconductor layer 110 may be formed to exhibit a charge concentration of about $1 \times 10^{14}$ atom/cm$^3$ to about $1 \times 10^{17}$ atom/cm$^3$, as will be discussed in more detail below.

Formation of the transparent semiconductor layer 110 will be described in more detail below. The substrate 100 may be placed in a chamber, and precursors of a transparent material for forming a transparent semiconductor film may be injected into the chamber to form, e.g., a zinc oxide film, by an ALD method. Once the transparent semiconductor film is formed to a predetermined thickness, the transparent semiconductor film may be patterned to form the transparent semiconductor layer 110, e.g., a zinc oxide layer, on the substrate 100.

For example, a zinc precursor, e.g., diethylzinc, with a carrier gas may be injected into the chamber, so that the zinc precursor reactants, i.e., zinc, may be adsorbed onto the substrate 100. Next, an inert gas, e.g., nitrogen and/or argon, may be injected into the chamber to remove residue, e.g., non-adsorbed molecules, from the chamber. Then, an oxidizing gas, e.g., ammonium hydride ($NH_4OH$), NO, $N_2O$, or $HNO_3$, may be injected into the chamber to oxidize the zinc adsorbed to the substrate 100 by surface chemical reaction to form a zinc oxide layer on the substrate 100. Then, the inert gas may be injected again into the chamber to remove residue. The inert gas, e.g., argon (Ar) gas, may be injected into the chamber for about 8 seconds, e.g., each time the chamber is purged from residues. The above steps, i.e., injection of zinc precursors, inert gas, and oxidizing gas, may be repeated several times to form the zinc oxide layer to a desired thickness.

The ALD may be performed at low temperature, so material exhibiting relatively low strength or instability at high temperatures, e.g., plastic, may be used to form the substrate 100. For example, since the transparent semiconductor layer 110 may be processed by ALD at a relatively low temperature, the substrate 100 may be formed, e.g., of plastic, to fabricate, e.g., a flexible and transparent FPD device.

Further, the transparent semiconductor layer 110, e.g., a zinc oxide layer, formed via the ALD by using an oxidizing gas including nitrogen may exhibit reduced charge concentration, i.e., a charge concentration of about $1\times10^{14}$ atom/$cm^3$ to about $1\times10^{17}$ atom/$cm^3$. Therefore, off-current characteristics of the transparent semiconductor layer 110 may be enhanced. When charge concentration is less than about $1\times10^{14}$ atom/$cm^3$, the semiconductor layer may have strong insulation characteristics, and when charge concentration is more than about $1\times10^{17}$ atom/$cm^3$, the semiconductor layer may exhibit poor off-current characteristics.

In particular, a conventional, e.g., silicon, semiconductor layer of a TFT may include n-type dopants of a group 5A elements, e.g., P, As, and so forth, and/or p-type dopants of a group 3A elements, e.g., B, Al and so forth. An inorganic semiconductor including two or more elements, e.g., the transparent semiconductor layer 110, may require, however, doping by components corresponding to the material of the inorganic semiconductor and in stoichiometric proportion with respect to the material of the inorganic semiconductor. For example, a zinc oxide semiconductor layer may have an increased ratio of Zn to O instead of n-type dopants and group 5A elements, e.g., N, P or As, as p-type dopants.

In other words, since an oxygen vacancy (Vo) or a lattice defect of Zn interstitial (Zni) may function as n+ region, an NMOS device having a zinc oxide semiconductor layer may be formed to include an n+ region by increasing a ratio of Zn to O provided to the chamber, i.e., ALD chamber. Further, in a zinc oxide layer a group 5A element takes an oxygen site, thereby functioning as an acceptor, i.e., as opposed to functioning as a donor in a silicon layer, so a PMOS device having a zinc oxide semiconductor layer may be formed to include a p+ region by providing N, P, and/or As as dopant gas to the ALD chamber.

Thus, the transparent semiconductor layer 110 according to example embodiments may be formed by using an oxidizing agent having nitrogen, so the nitrogen (N) may function as an acceptor, thereby reducing free charge concentration in the transparent semiconductor layer 10. Accordingly, the transparent semiconductor layer 110 may be formed to have a charge concentration of about $1\times10^{14}$ atom/$cm^3$ to about $1\times10^{17}$ atom/$cm^3$. Therefore, off-current characteristics of the semiconductor layer may be enhanced, and thus a device having improved characteristics may be fabricated. In contrast, use of, e.g., water vapor or ozone, as oxidizing agents in a ALD when forming a zinc oxide layer may cause an unintentional doping process on the semiconductor layer, i.e., due to oxygen vacancies, to form a zinc oxide layer having a high charge concentration, e.g., higher than about $1\times10^{17}$ atom/$cm^3$, thereby making it difficult to use the resultant zinc oxide layer as a semiconductor layer.

Figure 1B:
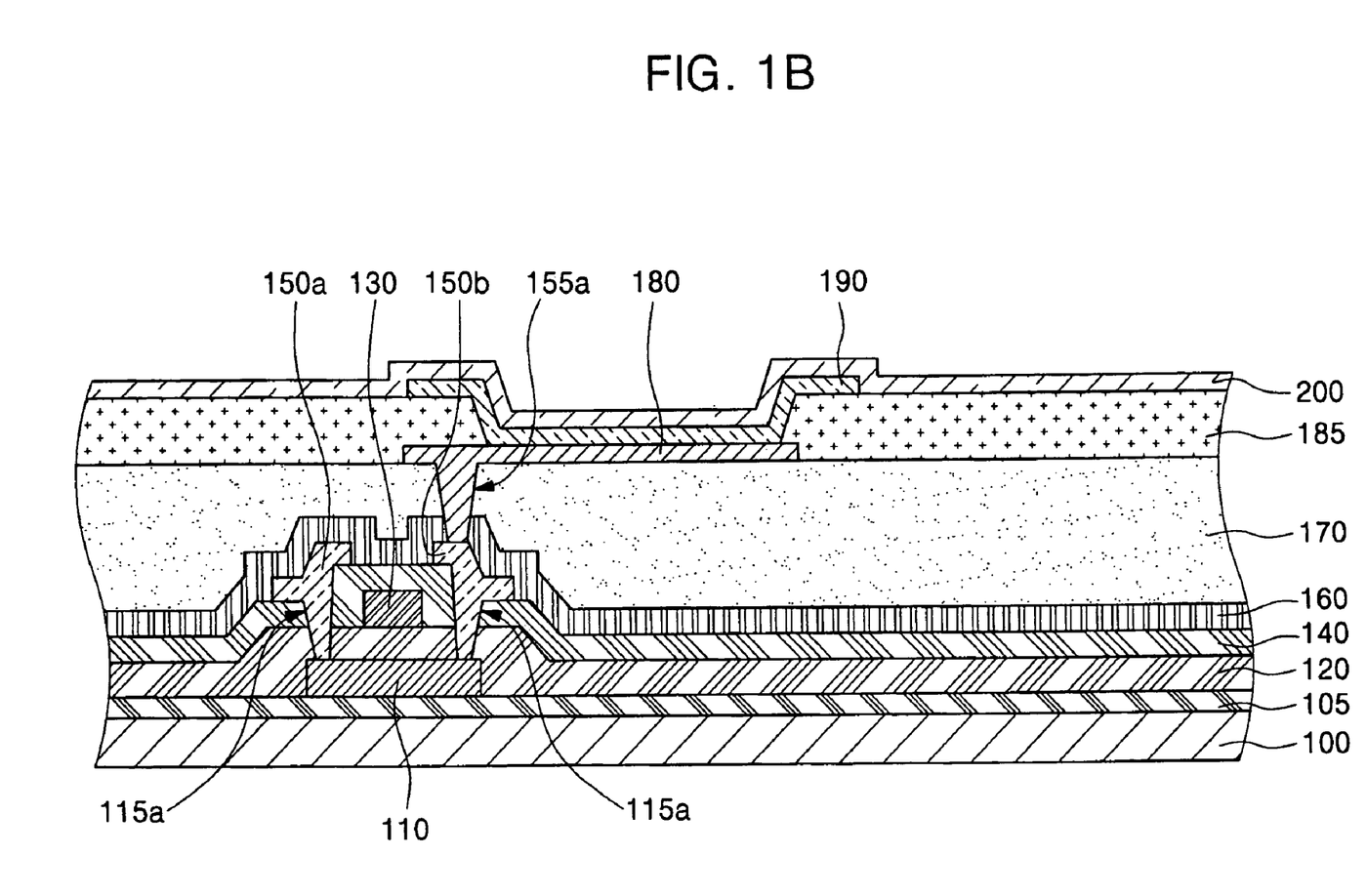
FIG. 1B illustrates a cross-sectional view of a FPD according to an example embodiment.
Figure 1C:
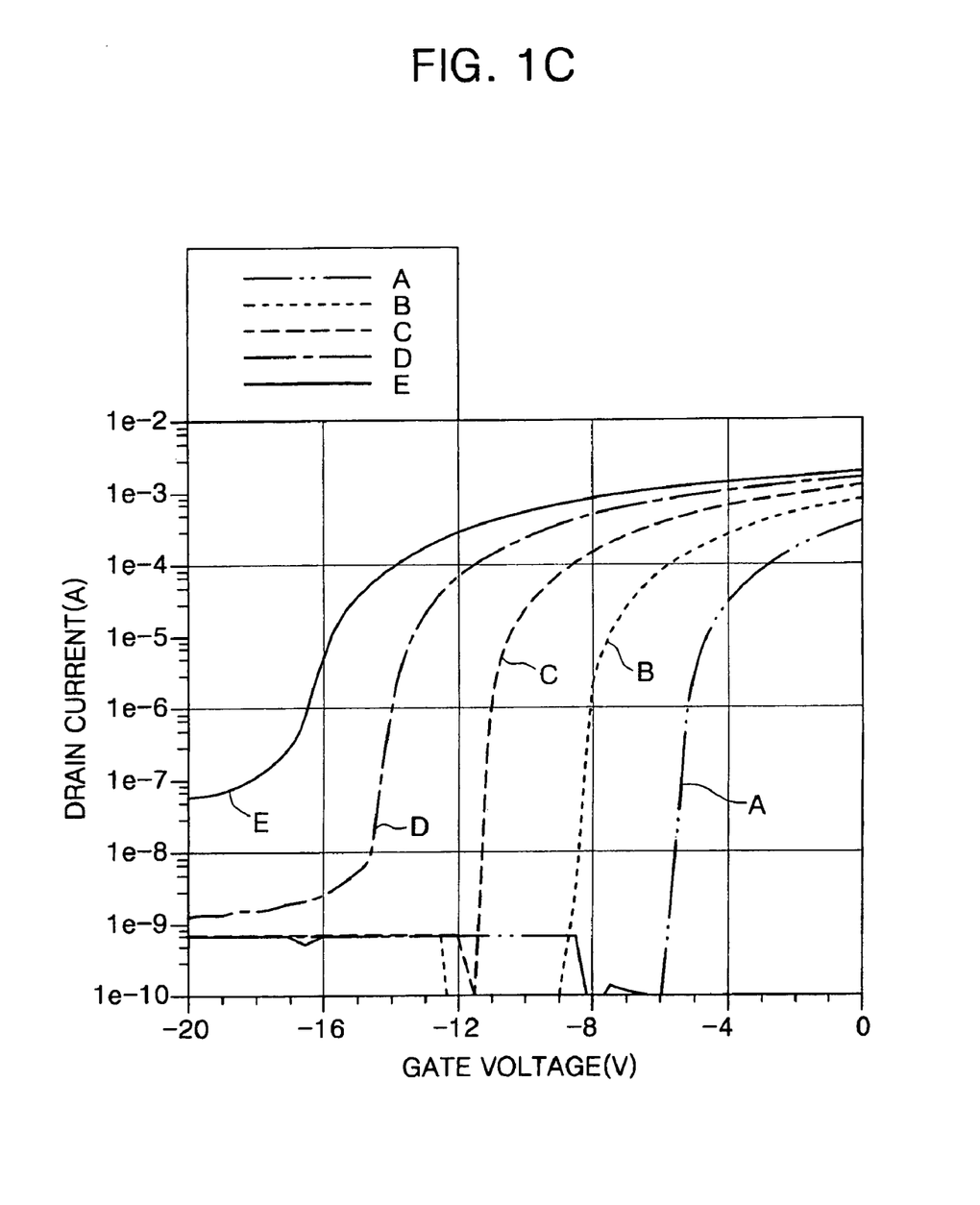
FIG. 1C illustrates a graph of off-current characteristics of TFTs with respect to charge concentration therein.

FIG. 1C illustrates a graph of off-current characteristics according to charge concentration of a semiconductor layer. In the graph of FIG. 1C, curve A is a plot at a charge concentration of $1\times10^{17}$ atom/$cm^3$, curve B is a plot at a charge concentration of $1.5\times10^{17}$ atom/$cm^3$, curve C is a plot at a charge concentration of $2.0\times10^{17}$ atom/$cm^3$, curve D is a plot at a charge concentration of $2.5\times10^{17}$ atom/$cm^3$, and curve E is a plot at a charge concentration of $3.0\times10^{17}$ atom/$cm^3$. As illustrated in FIG. 1C, curves A, B and C have an off-current value of about $1\times10^{-9}$A or less. As further illustrated in FIG. 1C, curve A having a charge concentration of $1\times10^{17}$ atom/$cm^3$ exhibits a sharp drop of drain current at a gate voltage of about –6V, while curves B and C exhibit a milder current drop, i.e., at a gate voltage of about –9V and –11.5 V, than curve A.

Since the current, i.e., drain current, in curves D and E is not reduced to $1\times10^{19}$ A and the gate voltage in curves B and C exhibits higher negative voltage than curve A, it may be concluded that semiconductor layers having charge concentration above about $1\times10^{17}$ atom/$cm^3$ exhibit insufficient off-current characteristics, thereby exhibiting poor semiconductor layer characteristics. In other words, a semiconductor layer according to an example embodiment may have a charge concentration of about $1\times10^{17}$ atom/$cm^3$ or less, thereby exhibiting superior characteristics as compared to a semiconductor layer having a charge concentration above about $1\times10^{17}$ atom/$cm^3$, i.e., a semiconductor layer formed by an atomic layer deposition using, e.g., ozone or water vapor as oxidizing agents.

The gate electrode 130 of the TFT, as illustrated in FIG. 1A, may be formed on the transparent semiconductor layer 110. In particular, a gate insulating layer 120 may be formed of an oxide, e.g., a silicon oxide layer, a nitride, e.g., a silicon nitride layer, a transparent insulating material, or a combination thereof, on the transparent semiconductor layer 110. Next, the gate electrode 130 may be formed of any suitable transparent or semi-transparent material, e.g., one or more of indium tin oxide (ITO), indium zinc oxide (IZO), indium tin zinc oxide (ITZO), and a semi-transparent metal exhibiting conductivity and transparency, on the gate insulating layer 120. An interlayer insulating layer 140 may be formed of an oxide, e.g., a silicon oxide layer, a nitride, e.g., a silicon nitride layer, a transparent insulating material, or a combination thereof, on the gate electrode 130.

As further illustrated in FIG. 1A, contact holes 115a may be formed through the interlayer insulating layer 140 and through the gate insulating layer 120 to expose portions of an upper surface of the transparent semiconductor layer 110. The source/drain electrodes 150a and 150b may be formed on the interlayer insulating layer 140 and in the contact holes 115a, so the source/drain electrodes 150a and 150b may be connected to the transparent semiconductor layer 110 through the contact holes 115a. The source and drain electrodes 150a and 150b may be formed of any suitable transparent or semi-transparent material, e.g., one or more of ITO, IZO, ITZO, and a semi-transparent metal exhibiting conductivity and transparency.

A FPD device, e.g., an OLED display device, including the TFT illustrated in FIG. 1A will be described with reference to FIG. 1B. Referring to FIG. 1B, an OLED display device may include the TFT described previously with reference to FIG. 1A, a passivation layer 160 on an entire surface of the substrate 100 to cover the TFT, a planarization layer 170 on the passivation layer 160, and an OLED on the planarization layer 170.

In particular, a via hole 155a may be formed through the planarization layer 170 and through the passivation layer 160 to expose a portion of any one of the source and drain electrodes 150a and 150b of the TFT. A first electrode 180 of the OLED may be formed on the planarization layer 170, and may be electrically connected with any one of the source and drain electrodes 150a and 150b through the via hole 155a. An organic layer 190 and a second electrode 200 may be sequentially formed on the first electrode 180 to complete the OLED. A pixel defining layer 185 may be formed between the planarization layer 170 and the second electrode 200, e.g., a portion of the pixel defining layer 185 may be removed to expose an upper surface of the first electrode 180 to form the organic layer 190 and the second electrode 200 therein.

Figure 2A:
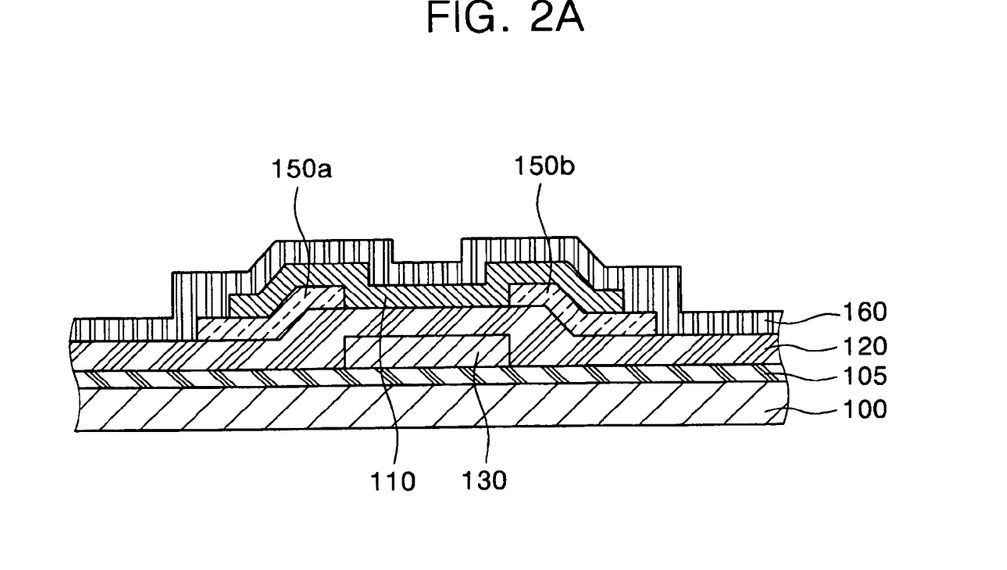
FIG. 2A illustrates a cross-sectional view of a TFT according to another example embodiment; and and 2B illustrates a cross-sectional view of a FPD according to another example embodiment.

A TFT and a FPD device including the TFT according to other example embodiments will be described with reference to FIGS. 2A and 2B, respectively. FIG. 2A illustrates a cross-sectional view of a TFT according to another example embodiment. Referring to FIG. 2A, a TFT may be substantially the same as the TFT described previously with reference to FIG. 1A, with the exception of orientation of the gate electrode 130 with respect to the substrate 100 and gate insulation layer 120.

More specifically, as illustrated in FIG. 2A, the gate electrode 130 may be formed on the buffer layer 105, and a gate insulating layer 120 may be formed on the entire surface of the substrate 110 to cover the gate electrode 130, so the gate electrode 130 may be between the substrate 100 and the gate insulating layer 120. After that, source and drain electrodes 150a and 150b may be formed on the gate insulating layer 120.

A zinc oxide layer may be formed on the source and drain electrodes 150a and 150b by atomic layer deposition. Then, the zinc oxide layer may be patterned to form the transparent semiconductor layer 110. The transparent semiconductor layer 110 may be formed to a thickness of about 30 nm to about 150 nm, and may have a charge concentration of about $1 \times 10^{14}$ atom/cm$^3$ to about $1 \times 10^{17}$ atom/cm$^3$. The transparent semiconductor layer 110 of FIG. 2A and a method of manufacturing the same may be substantially identical to the transparent semiconductor layer 110 described previously with reference to FIG. 1A and, therefore, details will not be repeated. Subsequently, a passivation layer 160 may be formed on the entire surface of the substrate 100 to cover the transparent semiconductor layer 110, and thus the TFT according to an example embodiment may be completed.

Figure 2B:
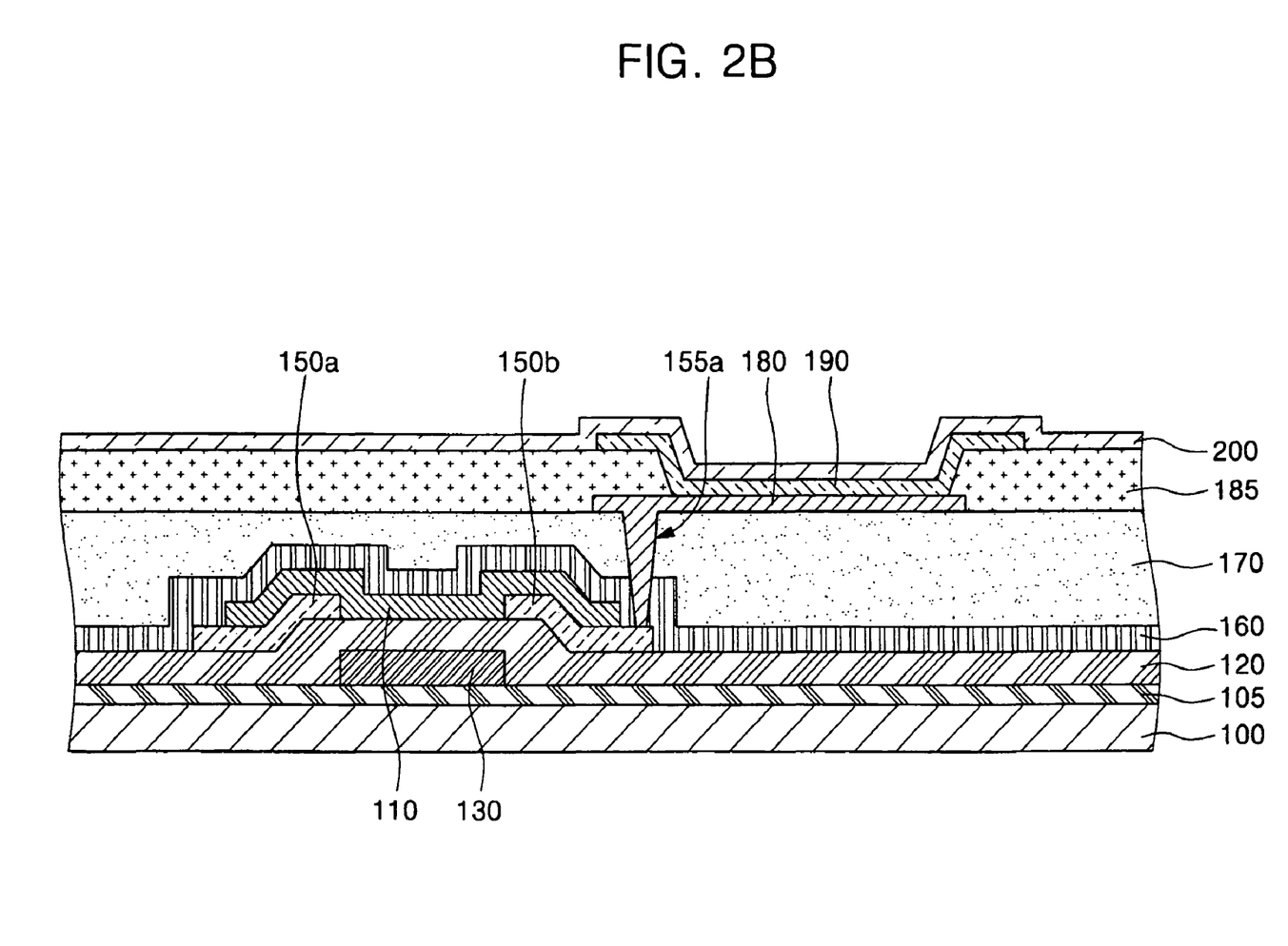

Referring to FIG. 2B, a FPD may include the TFT described previously with reference to FIG. 2A and an OLED. For example, a planarization layer 170 may be formed on the passivation layer 160 of the TFT, and a via hole 155a may be formed to expose one of the source and drain electrodes 150a and 150b through the passivation layer 160 and the planarization layer 170. The first electrode 180, organic layer 190, and second electrode 200 may be formed as described previously with reference to FIG. 1A.

Further, the present invention describes a controller connected to a light emitting panel using an OLED display device for convenience of description, but the controller may be applied to LCD devices, field emission display (FED) devices, plasma display panels (PDPs), electroluminescent display (ELD) devices, or vacuum fluorescent display (VFD) devices.

As described above, according to example embodiments, a TFT may include a zinc oxide semiconductor layer formed by ALD using an oxidizing gas having nitrogen, thereby exhibiting low charge concentration and improved characteristics. The TFT according to example embodiments may be used in any suitable display device, e.g., an OLED display device, a liquid crystal display (LCD) device, a field emission display (FED) device, a plasma display panel (PDP), an electroluminescent display (ELD) device, a vacuum fluorescent display (VFD) device, and so forth. Further, it is noted that even though example embodiments have been described with reference to top-gate and bottom-gate thin film transistors, other structures are within the scope of the present invention.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A thin film transistor (TFT), comprising:
   a substrate;
   a transparent semiconductor layer on the substrate, the transparent semiconductor layer including zinc oxide, the transparent semiconductor layer being an atomic deposition layer with a charge concentration of about $1 \times 10^{14}$ atom/cm$^3$ to about $1 \times 10^{17}$ atom/cm$^3$;
   a gate electrode on the substrate;
   a gate insulating layer between the gate electrode and the transparent semiconductor layer, the gate insulting layer insulating the gate electrode from the transparent semiconductor layer; and
   source and drain electrodes on the substrate, the source and drain electrodes being in contact with the transparent semiconductor layer.

2. The TFT as claimed in claim 1, wherein the transparent semiconductor layer is between the substrate and the gate insulating layer.

3. The TFT as claimed in claim 2, further comprising an interlayer insulating layer on the substrate, the gate insulating layer, gate electrode, and interlayer insulating layer being sequentially stacked on the transparent semiconductor layer, and the source and drain electrodes being connected to the transparent semiconductor layer through the gate insulating layer and interlayer insulating layer.

4. The TFT as claimed in claim 1, wherein the gate electrode is disposed between the substrate and the gate insulating layer.

5. The TFT as claimed in claim 4, wherein the source and drain electrodes are spaced apart from each other on the gate insulating layer, the source and drain electrodes being disposed to correspond to both sides of the gate electrode, and the transparent semiconductor layer being on the source and drain electrodes and including a portion on the gate insulating layer between the source and drain electrodes.

6. The TFT as claimed in claim 1, wherein the substrate includes one or more of a single crystalline silicon, glass, plastic, sapphire and quartz.

7. The TFT as claimed in claim 1, wherein the transparent semiconductor layer has a thickness of about 30 nm to about 150 nm.

8. The TFT as claimed in claim 1, wherein the transparent semiconductor layer is a p-type semiconductor layer.

9. A method of fabricating a thin film transistor (TFT), comprising:
   forming a transparent semiconductor layer on a substrate by atomic layer deposition, the transparent semiconductor layer including zinc oxide and exhibiting a charge concentration of about $1\times10^{14}$ atom/cm$^3$ to about $1\times10^{17}$ atom/cm$^3$;

forming a gate electrode on the substrate;

forming a gate insulating layer between the gate electrode and the transparent semiconductor layer, the gate insulting layer insulating the gate electrode from the transparent semiconductor layer; and forming source and drain electrodes on the substrate, the source and drain electrodes being in contact with the transparent semiconductor layer.

10. The method as claims in claim 9, further comprising:

forming a buffer layer on the substrate;

forming a zinc oxide layer on the buffer layer by atomic layer deposition using an oxidizing agent having nitrogen;

forming the transparent semiconductor layer by patterning the zinc oxide layer, a channel region of the transparent semiconductor layer having a charge concentration of about $1\times10^{14}$ atom/cm$^3$ to about $1\times10^{17}$ atom/cm$^3$;

forming the gate insulating layer on the transparent semiconductor layer;

forming the gate electrode on the gate insulating layer;

forming an interlayer insulating layer on the gate electrode; and forming the source and drain electrodes on the interlayer insulating layer, one of the source and drain electrodes being connected to a first electrode.

11. The method as claimed in claim 10, wherein the oxidizing agent includes one or more of ammonium hydroxide, nitrogen monoxide, nitrogen dioxide and nitric acid.

12. The method as claims in claim 9, further comprising:

forming the gate electrode on the substrate;

forming the gate insulating layer on the gate electrode;

forming the source and drain electrodes on the gate insulating layer, the source and drain electrodes being spaced apart from each and disposed to correspond to both sides of the gate electrode;

forming a zinc oxide layer on the source and drain electrodes by atomic layer deposition using an oxidizing agent having nitrogen; and patterning the zinc oxide layer to form the transparent semiconductor layer, the transparent semiconductor layer being connected with the source and drain electrodes and having a charge concentration of about $1\times10^{14}$ atom/cm$^3$ to about $1\times10^{17}$ atom/cm$^3$ in a channel region thereof.

13. The method as claimed in claim 12, wherein the oxidizing agent includes one or more of ammonium hydroxide, nitrogen monoxide, nitrogen dioxide and nitric acid.

14. A flat panel display (FPD) device, comprising:

a thin film transistor (TFT), including:

a substrate, a transparent semiconductor layer on the substrate, the transparent semiconductor layer including zinc oxide, the transparent semiconductor layer being an atomic deposition layer with a charge concentration of about $1\times10^{14}$ atom/cm$^3$ to about $1\times10^{17}$ atom/cm$^3$, a gate electrode on the substrate, a gate insulating layer between the gate electrode and the transparent semiconductor layer, the gate insulting layer insulating the gate electrode from the transparent semiconductor layer, and source and drain electrodes on the substrate, the source and drain electrodes being in contact with the transparent semiconductor layer; and a pixel part including at least one pixel and being in electrical communication with the TFT via at least one of the source and drain electrodes of the TFT.

15. The flat panel display device as claimed in claim 14, wherein the transparent semiconductor layer of the TFT has a thickness of about 30 nm to about 150 nm.

16. The FPD device as claimed in claim 14, wherein the FPD is an organic light emitting diode (OLED) display device.

\* \* \* \* \*